United States Patent
Wagenseil

(10) Patent No.: US 12,476,629 B2
(45) Date of Patent: Nov. 18, 2025

(54) DRIVER CIRCUIT WITH TWO CASCADING HALF-BRIDGE DRIVERS FOR ACTUATING THREE TRANSISTORS

(71) Applicant: Vitesco Technologies GmbH, Regensburg (DE)

(72) Inventor: Veit Wagenseil, Munich (DE)

(73) Assignee: VITESCO TECHNOLOGIES GMBH, Regensburg (DE)

( * ) Notice: Subject to any disclaimer, the term of this patent is extended or adjusted under 35 U.S.C. 154(b) by 115 days.

(21) Appl. No.: 18/573,054

(22) PCT Filed: Jun. 22, 2022

(86) PCT No.: PCT/EP2022/067055
§ 371 (c)(1),
(2) Date: Dec. 21, 2023

(87) PCT Pub. No.: WO2023/274815
PCT Pub. Date: Jan. 5, 2023

(65) Prior Publication Data
US 2024/0291474 A1 Aug. 29, 2024

(30) Foreign Application Priority Data

Jun. 30, 2021 (DE) ...................... 10 2021 206 853.7

(51) Int. Cl.
H03K 17/06 (2006.01)
H02M 1/42 (2007.01)
H03K 17/0812 (2006.01)

(52) U.S. Cl.
CPC ........ H03K 17/063 (2013.01); H02M 1/4233 (2013.01); H03K 17/08122 (2013.01)

(58) Field of Classification Search
CPC .......... H03K 17/063; H03K 17/08122; H02M 1/4233; H02M 1/38; H02M 1/4216;
(Continued)

(56) References Cited

U.S. PATENT DOCUMENTS

| 10,985,673 B1 * | 4/2021 | Sato .................... H02M 3/1584 |
| 2014/0369101 A1 | 12/2014 | Nguyen |
| 2017/0271995 A1 | 9/2017 | Takaku |

FOREIGN PATENT DOCUMENTS

| CN | 111740573 A | 10/2020 |
| DE | 102013211010 A1 | 12/2014 |
| EP | 1619782 A2 | 1/2006 |

OTHER PUBLICATIONS

International Search Report and Written Opinion for International Application No. PCT/EP2022/067055, mailed Oct. 6, 2022, 13 pages.
(Continued)

*Primary Examiner* — Jung Kim
(74) *Attorney, Agent, or Firm* — Buchanan Ingersoll & Rooney PC

(57) ABSTRACT

A driver circuit for a PFC cell is described. The PFC cell has a half-bridge with two half-bridge switches connected via a connection point. A star point switch connects the connection point to a star point of the PFC cell. The driver circuit has a target control signal input for target actuation signals and two half-bridge drivers connected downstream. The half-bridge drivers are configured to transmit signals from the inputs to the outputs only when they are not both in the HIGH state. The first output of the first half-bridge driver is connected to a control output of the driver circuit for the star point switch. At least one input of the second half-bridge driver is connected downstream of the second output of the first half-bridge driver. Two outputs of the second half-bridge driver are connected to control outputs of the driver circuit for the two half-bridge switches.

9 Claims, 1 Drawing Sheet

(58) Field of Classification Search
CPC ...... H02M 7/487; H02M 1/4225; H02M 1/08; Y02B 70/10; Y02T 10/64; Y02T 10/70; Y02T 10/7072; Y02T 10/72; Y02T 90/14; B60L 3/003; B60L 15/007; B60L 2210/42
See application file for complete search history.

(56) References Cited

OTHER PUBLICATIONS

International Search Report and Written Opinion for International Application No. PCT/EP2022/067055, mailed Oct. 6, 2022, 12 pages (German).
German Examination Report for German Application No. 10 2021 206 853.7, dated Aug. 31, 2021 with translation, 9 pages.

\* cited by examiner

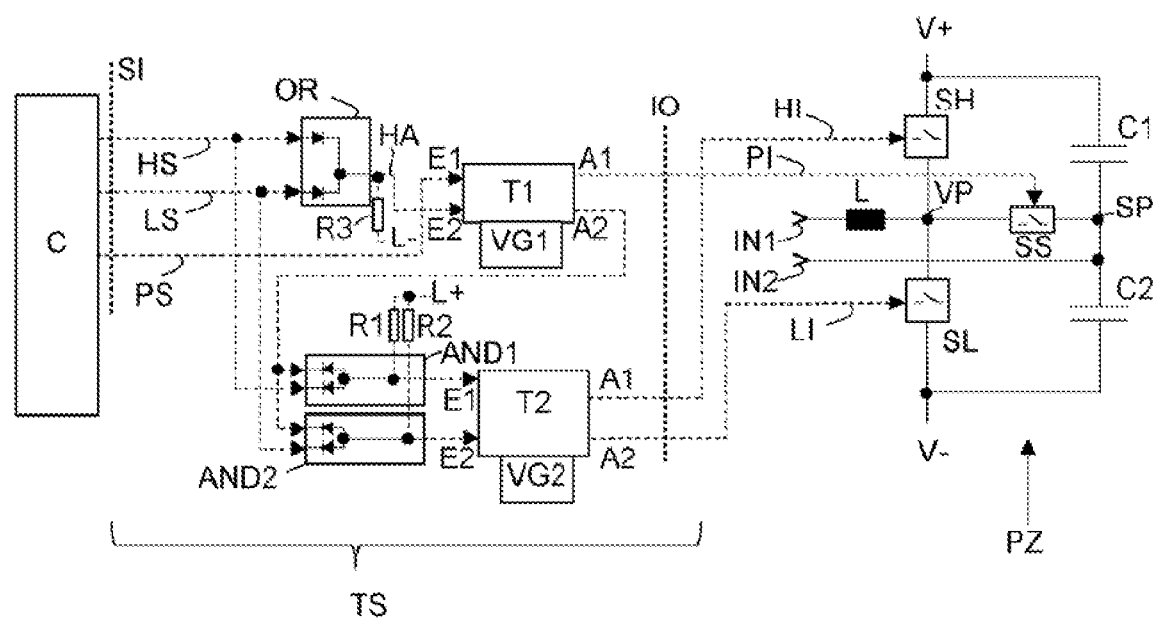

DRIVER CIRCUIT WITH TWO CASCADING HALF-BRIDGE DRIVERS FOR ACTUATING THREE TRANSISTORS

CROSS REFERENCE TO RELATED APPLICATIONS

This application is the U.S. National Phase Application of PCT International Application No. PCT/EP2022/067055, filed Jun. 22, 2022, which claims priority to German Patent Application No. 10 2021 206 853.7, filed Jun. 30, 2021, the contents of such applications being incorporated by reference herein.

BACKGROUND OF THE INVENTION

It is known practice to use half-bridge circuits to adjust from DC voltage to alternating current. In multi-phase designs, this will be used to generate a rotating field in electrical machines.

A half-bridge circuit has a series connection of two transistors, wherein a DC voltage is applied to the series connection for supply. A corresponding half-bridge driver circuit must therefore not only ensure the generation of the desired AC voltage, but also avoid both transistors from being on simultaneously in order to thus avoid a bridge short circuit. Appropriate driver circuits for half-bridges, i.e. for units with two transistors, are known and available in numerous designs.

For actuating a cell of a power factor correction circuit (for short below: PFC), however, three signals are required depending on the type of PFC: two signals for actuating the half-bridge of the cell and one signal for actuating the switch which switchably connects a star point of the cell to the connection point of the transistors of the half-bridge (referred to as a star point switch), and has a significant influence on the level of the output voltage or the power factor correction.

SUMMARY OF THE INVENTION

An aspect of the invention aims to show a possibility with which a driver circuit for PFC can be built in a simple way with available means.

It has been recognized that, when actuating PFC, it is important not only to ensure that the half-bridge does not generate a bridge short circuit, but also to avoid a high current due to discharge/charging processes of a capacitor of the PFC cell, which can be caused by simultaneously switching on one of the switches of the half-bridge and the start point switch. In order to be able to resort to known and easily accessible components, it is proposed to construct a driver circuit with two cascaded half-bridge drivers. These are each configured to actuate two transistors and have a protective mechanism which, in the event of faulty actuation by means of two simultaneous ON signals (target control signals) at the input of the half-bridge driver, ensures that these target control signals are not transmitted to the output of the half-bridge driver. In the event of a simultaneous ON signal at the two inputs of the half-bridge driver, the protective mechanism can be configured to set both outputs to OFF, to set only one output to OFF, and/or to emit a fault signal or to establish a fault state in which both outputs do not have an ON level (i.e. only one output with an ON level, the other with an OFF level or both outputs with an OFF level), which preferably lasts until a reset signal or for a minimum period of time.

It is proposed to cascade a first and a second half-bridge driver. Target control signals are emitted to the half-bridge drivers and these are emitted, taking into account the protective mechanism, as actual control signals to the relevant transistors (generally: switches). If correctly actuated (i.e. the target control signal corresponds to the rule: two or three switches not ON at the same time), the cascaded half-bridge drivers transmit the target control signals (i.e. the signals at the target control signal input) to the actual control signal output or to the connected switches. In the event of faulty actuation (i.e. target control signal means: two or three switches ON at the same time), the cascaded half-bridge drivers do not transmit the target control signals (i.e. the signals at the target control signal input) to the actual control signal output or to the connected switches or change them in such a way that two or three switches are not ON at the same time or their control signals have a HIGH level.

The second half-bridge driver receives a signal from the first half-bridge driver. This results in the cascading. The first half-bridge driver receives a signal at a first input that indicates whether one of the two half-bridge switches (or both) is actuated with an ON signal. A (first) logical combination, in particular an ORing, can be used to determine this from the two target control signals from the half-bridge switches. The first half-bridge driver receives a signal at a second input that corresponds to the actual control signal from the star point switch. A first output of the first half-bridge driver is assigned to the first input (i.e. in the fault-free state, the signal from the first input is transmitted to the first output). A second output of the first half-bridge driver is assigned to the second input (i.e. in the fault-free state, the signal from the second input is transmitted to the second output). The signal from the second output of the first half-bridge driver is supplied to the second half-bridge driver (on the input side), preferably via a (second) logical combination. The second half-bridge driver is thus connected downstream of the first half-bridge driver in the sense of cascading.

The target control signals provided for the half-bridge switches are supplied to the second half-bridge driver. In this case, a first input of the second half-bridge driver is supplied with the target control signal which is assigned to the first half-bridge switch, and a second input of the second half-bridge driver is supplied with the target control signal which is assigned to the second half-bridge switch. Preferably, these signals are supplied to the inputs of the second half-bridge driver via a logical combination (i.e. the second logical combination) which respectively combines the relevant signals with the signal that is emitted by the second input of the second half-bridge driver. This logical combination is provided by a first and a second ANDing, wherein the first ANDing combines the signal from the second output of the first half-bridge driver with the target control signal from the first half-bridge switch, and the second ANDing combines the signal from the second output of the first half-bridge driver with the target control signal from the second half-bridge switch. Thus, the target control signals from the first and the second half-bridge switch are respectively combined with the signal from the second output of the first half-bridge driver. The output signals from the logical combination or the two ANDing processes are supplied to the first and second inputs of the second half-bridge driver.

If the first half-bridge driver receives an ON signal for the star point switch at the first input, the half-bridge driver generates an OFF signal at the second output (since the first output or the first input already provides an ON signal). This means that the logical combination, via which the target signals are passed to the inputs of the second half-bridge driver, can cause the second half-bridge driver to receive no ON signal if there is an ON signal for the star point switch. Only when the first half-bridge driver receives an OFF signal for the star point switch at the first input can an ON level of a target control signal provided for the half-bridge switches lead to the second output of the first half-bridge driver giving an ON signal to the logical combination, which signal results in an ON signal provided for the half-bridge switches reaching an input of the second half-bridge driver. The first half-bridge driver monitors and transmits (according to the protective mechanism) the target control signal for the star point switch (via its first output). The first half-bridge driver can emit a signal "HIGH" at the other, second output only when the signal provided for the star point switch is "LOW". The signal emitted at this second output thus indicates whether the star point switch is actuated with "OFF" and enables the logical combination upstream of the second half-bridge driver or enables the second half-bridge driver itself to emit ON signals (target control signals) for one of the semiconductor switches in the form of actual control signals to the relevant semiconductor switch. This is made possible by cascading the half-bridge drivers. The second half-bridge driver is configured to itself check (again) that both target control signals provided for the half-bridge switches are not ON signals, in order to pass these on as actual control signals only when this condition is met, wherein in particular the connection of the first half-bridge switch to the input of the second half-bridge switch ensures that the signals from the half-bridge switches are passed on to the second driver only when an OFF signal is provided for the star point switch. These conditions correspond to aspects of the protective mechanism mentioned. In other words, as a result of the cascading, a signal is transmitted from the first half-bridge driver to the second half-bridge driver, said signal indicating whether the target or actual control signal from the star point switch actually corresponds to an open switching state, i.e. indicating whether, due to the open-actuated star point switch, it is possible to transmit an ON level of one of the two target actuation signals from the half-bridge switches as an actual actuation signal to the relevant half-bridge switch. If this is not possible due to a closed-actuated star point switch, this is specified by connecting the second half-bridge driver downstream of the first half-bridge driver. This specification is implemented by the second half-bridge driver which does not emit an ON signal as the actual control signal when it is transmitted from the first half-bridge driver (in the form of a low level) to the second half-bridge driver that none of the half-bridge switches is to be switched on. This concerns the signal transmitted from the second output of the first half-bridge driver to the second half-bridge driver. In other words, the first half-bridge driver drives the star point switch in a fault-free state or actuates it according to an associated target signal. A fault-free state is when only the star point switch is to receive a HIGH level (target actuation signal) from all switches or when only one (not both) of the two half-bridge switches is to be actuated with a HIGH level from all switches (for which a logical combination of these signals can be used, which is upstream of the inputs of the first half-bridge driver, such as an ORing).

A driver circuit for a PFC cell is described. The PFC cell, for which the driver circuit is designed, has a half-bridge with two half-bridge switches connected via a connection point. The PFC cell also has a star point switch. This connects the connection point to a star point of the PFC cell. The star point can be formed from the linking point of two capacitors connected in series. The ends of the resulting series connection of the capacitors can be connected to different potentials of a DC voltage connection of the PFC cell. The PFC cell can also be described as a power factor correction circuit cell, i.e. a cell of a power factor correction circuit.

The switches are semiconductor switches. The half-bridge switches are preferably each designed as a MOSFET or IGBT. The star point switch may be designed as a transistor without an inverse diode, i.e. as a transistor which can be turned off in a bidirectional manner, or as a series connection of antiserially aligned transistor elements having inverse diodes, in order to obtain a bidirectional transistor device forming the star point switch. If the star point switch is formed as a transistor device with two transistor elements and the transistor elements have inverse diodes, then the forward directions of the transistor elements are opposite one another. The driver circuit may have an output (actual control signal output) which can be used to connect the switches of the described PFC cell. In this embodiment, the PFC cell is not part of the driver circuit.

The driver circuit has a target control signal input for target actuation signals. The target control signal input is configured for three individual control signals that can be input to the driver circuit, for example from a target control signal source which may be present in the form of a PFC controller. The target control signal source can be present as an ASIC or microprocessor with appropriate programming.

The driver circuit also has a first and a second half-bridge driver. Each half-bridge driver has two inputs and two outputs. Each output is assigned to exactly one input of the relevant half-bridge driver. Each half-bridge driver is configured to transmit a signal at the input to the associated output. Each half-bridge driver has a protective mechanism that transmits the signals from the two inputs to the associated outputs only when both inputs do not correspond to an ON signal at the same time. The ON signal is preferably represented by a logical HIGH level, but a complementary assignment is also possible. An OFF signal is preferably represented by a logical LOW level, but a complementary assignment is also possible. The half-bridge drivers are connected downstream of the target signal input. The signals from the target signal input are transmitted from the half-bridge drivers to an actual control signal output of the driver circuit, provided that the protective mechanism does not take effect. If the protective mechanism of the half-bridge drivers takes effect (i.e. two or three of the signals at the target signal input correspond to an ON signal at the same time), then at least one actual control signal is converted into an OFF control signal when transmitted by means of the half-bridge drivers. In particular, all actual control signals can then be output as an OFF control signal, irrespective of the signals at the target signal input.

The half-bridge drivers are connected (directly or indirectly or via a logical combination) downstream of the target control signal input. Each of the two half-bridge drivers is equipped with two inputs and two outputs in each case. Preferably, recourse is had to driver components which have only two inputs and outputs and not more than two. The half-bridge drivers are configured to transmit signals from the inputs to the outputs only when the protective mechanism does not take effect, i.e. when they are not both in the HIGH state (i.e. a state corresponding to an ON signal). The "HIGH" state can be provided by a high logic signal level.

The first half-bridge driver is provided for the purpose of transmitting (taking into account the protective mechanism)

the switching signal for the star point switch, in particular its first input or the associated first output. The first output of the first half-bridge driver is connected to a control output for the star point switch. The control output is part of the driver circuit and in particular part of an actual control signal output of the driver circuit. The control output is a signal output for an actual control signal provided for the star point switch.

At least one input of the second half-bridge driver is connected downstream of the second output of the first half-bridge driver, in particular via a logical combination. The two outputs of the second half-bridge driver are connected to control outputs for the two half-bridge switches. The control outputs are part of the driver circuit and in particular part of the actual control signal output of the driver circuit. The control outputs connected to the outputs of the second half-bridge driver are signal outputs for two actual control signals provided for the two half-bridge switches. The signal outputs described here or the actual control signal output form(s) the interface for the switches of the PFC cell or for the control inputs thereof (e.g. gate connections).

A logical combination is provided between the target control signal input, in particular the signal inputs for the target control signals of the half-bridge switches. This determines whether (at least) one of the target control signals from the half-bridge switches is in the HIGH state or passes on an ON state, and passes on a corresponding signal to the second input of the first half-bridge driver, in particular a HIGH signal, if this condition is met. The signal emitted by this logical combination reflects an active state of the half-bridge, in which (at least) one half-bridge switch is closed or actuated accordingly. The logical combination is preferably implemented as an OR gate. The OR gate can be realized by a hard-wired circuit or by a logical equivalent of the function. The OR gate may have a diode that connects the signal input for the target control signal from the first half-bridge switch to the second input of the half-bridge driver. The OR gate may have a further diode that connects the signal input for the target control signal from the second half-bridge switch to the second input of the half-bridge driver. It is possible to provide a connection, for instance a pull-up resistor, which connects the second input of the half-bridge driver to a level that can correspond to a LOW level or a signal level that reflects an open switching state (of a switch).

The (two) inputs of the OR gate or the logic combination mentioned are configured to receive the target actuation signals provided for the two half-bridge switches. For this purpose, the inputs of the OR gate can be individually connected to the signal inputs for the target control signals from the half-bridge switches. The OR gate has an output that has a signal-transmitting connection to the second input of the first half-bridge driver. In one embodiment, this input receives a HIGH signal from the OR gate if at least one of the target control signals provided for the half-bridge switches has a HIGH level. Without corresponding target control signals or at LOW levels of the target control signals, the second input of the first half-bridge driver receives a LOW level.

A further logical combination may be provided between the inputs of the second half-bridge driver on the one hand and the signal inputs provided for the half-bridge switches and the second output of the first driver circuit on the other hand. This logical combination can provide for the ON signals provided for the half-bridge switches to be passed on to the second half-bridge switch only when the second output of the first half-bridge driver has a HIGH level or when the first output of the first half-bridge switch (i.e. the control output for the star point switch) has a LOW level or corresponds to an OFF signal. This logical combination can be hard-wired or implemented by an ASIC or programmed microprocessor. In one embodiment, a first and a second AND gate are provided between the first half-bridge driver and the second half-bridge driver. In particular, the two AND gates are provided for the signal transmitted from the first half-bridge driver to the second half-bridge driver. Two AND gates are provided for this signal or in the connection between the first and second half-bridge drivers. A further connection, namely a connection between the control inputs for the half-bridge switches and the second half-bridge switch, passes through the AND gate.

According to the embodiment, a first input of the first AND gate is configured to receive the target actuation signal provided for the first half-bridge switch. In this respect, the first AND gate is provided between the control input for the first half-bridge switch and the first input of the second half-bridge driver. The second AND gate is provided between the control input for the second half-bridge switch and the first input of the second half-bridge driver. A first input of the second AND gate is configured to receive the target actuation signals provided for the second half-bridge switch. The two AND gates each have a second input. This has a signal-transmitting connection to the second output of the first half-bridge driver. In this respect, the AND gates are connected downstream of the first half-bridge driver. The AND gates are also connected upstream of the second half-bridge driver in this respect. This further logical combination is interposed in relation to the signal transmission between the control inputs for the half-bridge switches and the second half-bridge driver. The AND gates are connected upstream of the second half-bridge driver. In particular, an output of the first AND gate has a signal-transmitting connection to the first input of the second half-bridge driver. An output of the second AND gate has a signal-transmitting connection to the second input of the second half-bridge driver (T2). The inputs of the second half-bridge driver can be connected to a logical HIGH level via respective pull-up resistors. If no signal is provided by the AND gates, both inputs of the second half-bridge driver are at HIGH and the second half-bridge driver does not output an ON signal for the half-bridge switches at any of its outputs.

It can thus be provided that the inputs of the second half-bridge driver are each connected to a logical HIGH potential via a pull-up resistor. A first pull-up resistor connects the first input of the second half-bridge driver to the logical HIGH potential, and a second pull-up resistor connects the second input of the second half-bridge driver to the logical HIGH potential. This is provided in particular when there is a logical combination, in particular in the form of the AND gates, between the first and the second half-bridge driver. Alternatively or additionally, the second input of the first half-bridge driver can be connected to a logical LOW potential via a pull-down resistor. This is provided in particular when there is a logical combination, in particular in the form of the OR gate, between the target control signal input (in particular the control inputs for the half-bridge switches) and the first half-bridge driver.

One aspect is a delay function within the first and/or second half-bridge driver. This may be provided by an external circuit connected to the respective half-bridge driver, or by the respective half-bridge driver itself. The first and/or the second half-bridge driver may have a delay element. The delay element(s) is or are configured to delay the transmission of signals from the input to the output of the relevant half-bridge driver. This prevents overlapping HIGH signals which would otherwise cause two switches of the PFC cell to be closed simultaneously for a short time. The delay function takes into account in particular dead times of the relevant half-bridge driver. Such a delay element can be designed as an RC element. The half-bridge driver(s) may have a delay input, to which corresponding devices for adjusting the delay are connected, such as a resistor or an RC element. The delay can also be implemented in at least one of the gates or logical combinations.

The delay elements have a particular effect on enable signals for enabling actuation signals at the output of the relevant half-bridge driver or on HIGH signals at the input of the relevant half-bridge driver or at the output of the relevant half-bridge driver. A HIGH signal present at the input can be delayed by the delay elements. A HIGH signal to be output to an output can also be delayed by the delay elements. Preferably, the delay elements act on enable signals or on HIGH signals present at the half-bridge driver. The transmission provided by the half-bridge drivers from their input to their output can take place via the delay elements or be delayed by the latter. The half-bridge drivers are designed for this purpose.

It is possible to provide a control circuit which has the driver circuit or a plurality of the driver circuits. The control circuit is also equipped with a target control signal source. This source or its (multi-part) output is connected to the (multi-part) target control signal input. The source is configured to emit target actuation signals which are provided for the two half-bridge switches and for the star point switch. The at least one driver circuit and thus the control circuit may have at least one actual control signal output which is configured to emit actual control signals which are provided for the half-bridge switches and the star point switch. This refers to the switches of the PFC cell that can be connected to the actual control signal output. The control circuit may be configured to emit, at the actual control signal output, signals which are formed according to a predefined target output voltage of the PFC cell and/or according to a target phase angle of an alternating current (compared to an AC voltage profile) and/or according to a target power factor of the PFC cell.

The control circuit may be designed for a plurality of PFC cells, for example for a multi-phase power factor correction filter having a plurality of PFC cells and thus also a plurality of driver circuits (one driver circuit per PFC cell). The control circuit may have a plurality of the driver circuits. Thus, the control circuit is designed to actuate a plurality of the PFC cells. One embodiment provides a three-phase control circuit with three driver circuits. This embodiment is designed for a three-phase power factor correction filter having three PFC cells (one per phase). One area of application would be the rectification of three-phase AC voltage with simultaneous phase or power factor correction. A three-phase control circuit would be configured to actuate this rectification as well as the power factor correction.

A single-phase or multi-phase power factor correction circuit is also described. The has one or more PFC cells, where the number of PFC cells corresponds to the phase number of the power factor correction circuit. The power factor correction circuit has one or more driver circuits which are designed as described here. An associated driver circuit is provided for each PFC cell. Each PFC cell has a half-bridge. The half-bridge corresponds to two half-bridge switches that are connected (serially) via a connection point. Each PFC cell has a star point switch. In particular, each PFC cell has a working inductance. This connects the connection point (of the half-bridge) to a first AC voltage input of the PFC cell. Especially in a single-phase design, a second AC voltage input is connected to the star point of the PFC cell. The star point is formed by a linking point of two capacitors connected in series with one another. The capacitors can be referred to as intermediate circuit capacitors. The capacitors are connected in parallel with the half-bridge. In other words, the series connection of the two capacitors is connected in parallel with the half-bridge, i.e. the series connection of the two half-bridge switches. The ends of the half-bridges form two DC voltage outputs which are configured to be connected, for example, to a vehicle electrical system branch or a high-voltage storage battery.

A plurality of PFC cells, each having a half-bridge, are provided in a multi-phase power factor correction circuit. In the case of a multi-phase AC voltage input, each phase L1, L2, L3 of this input is connected to the connection point of the half-bridge of the relevant PFC cell via its own working inductance. In the case of a plurality of PFC cells of a power factor correction circuit, their star points can be connected to each other and form a common star point of the multi-phase power factor correction circuit. The common star point may be connected to a neutral conductor connection of the multi-phase AC voltage input, in particular in a switchable manner.

It is possible to provide an on-board AC voltage charging device which has at least one of the driver circuits or control circuits described here, and which preferably also has the power factor correction circuit described here. It is possible to provide an externally accessible vehicle charging connection ("plug-in socket", "charging socket") which is connected to the at least one PFC cell, preferably via the AC voltage input. An on-board high-voltage traction storage battery can be directly or indirectly connected to the half-bridges in order to charge it via the at least one PFC cell.

BRIEF DESCRIPTION OF THE DRAWINGS

The exemplary circuit in the FIGURE is used to explain features and aspects of the circuits described here.

DETAILED DESCRIPTION OF THE PREFERRED EMBODIMENTS

The FIGURE shows a single-phase power factor correction circuit PFC with a PFC cell PZ and a driver circuit TS. A target control signal source C is provided and is connected to the driver circuit TS. Together with this, the target control signal source C forms a control circuit.

The target control signal source C emits target control signals HS, LS, PS to the driver circuit TS via a target control signal input SI of the driver circuit TS. These three signals are intended for or assigned to three switches of the PFC cell (PZ). The three switches SH, SL, SS are intended to be actuated according to these signals HS, LS, PS. The driver circuit TS ensures that, in the event of faulty target control signals (more than one control signal simultaneously ON or at a HIGH level), the three switches SH, SL, SS are not actuated with the faulty control signals.

The PFC cell PZ to be actuated has a half-bridge which is formed by the half-bridge switches SH, SL which are connected in series with one another via the connection point VP. The PFC cell PZ to be actuated also has a star point switch which connects this connection point VP of the half-bridge to the star point SP of the PFC cell. The star point SP corresponds to the linking point of two capacitors C1, C2 which are connected in series, wherein this series connection is connected in parallel with the half-bridge. The connection point VP of the half-bridge is connected to a first AC voltage input IN1 via an inductance L. The star point is connected to a second AC voltage input IN2. The half-bridge has the task of rectification, wherein the star point switch SS (in particular together with the inductance) is used to adjust a power factor or a voltage conversion (or a level of the output voltage). The working inductance L, together with the half-bridge, can also act on a voltage conversion (or level of the output voltage) of the PFC cell. There are two DC voltage connections V+, V− which form outputs. The DC voltage connections V+, V− are connected to the ends of the half-bridge or the series connection of the capacitors C1, C2. Among other things, the driver circuit has the task of preventing a half-bridge short circuit through SH, SL and the task of preventing an excessively high inrush current which can reach the capacitors C1, C2 through SS when one of the switches SH or SL is closed. The same applies to a discharge current that emanates from the capacitor C1 or C2.

The driver circuit TS realizes this task or this protective mechanism by using two half-bridge drivers T1, T2 which are individually intended to actuate a half-bridge and therefore each have two inputs E1, E2 and two outputs A1, A2. These are cascaded in the FIGURE, with the result that together they are intended to actuate three switches, namely to actuate the switches SH, SL of the half-bridge and the star point switch SS.

The first half-bridge driver T1 receives, at its first input E1, the signal PS which is the target actuation signal for the star switch SS. The half-bridge driver T1 passes this signal on to its first output A1, provided that the protective mechanism does not take effect, i.e. if the signals at the inputs E1, E2 of the driver T1 are fault-free (i.e. do not both correspond to an ON state at the same time). The first output A1 is connected to the star point switch SS for actuation, for example to a control input of this switch (such as its gate). The second input E2 of the first half-bridge driver T1 receives a signal that combines or logically combines the two target actuation signals HS, LS provided for the half-bridge switches SH, SL. The combination or logical combination of these signals is an ORing provided by the OR gate OR. The resulting signal HA, which corresponds to the result of the logical combination or the OR gate OR, is transmitted to the input E2 of the half-bridge driver T1. The signal HA reflects whether the half-bridge is actively actuated, i.e. whether the target actuation signals for the half-bridge switches indicate that at least one of the half-bridge switches must be switched on. The half-bridge driver T1 passes this signal HA, which is present at the second input E2, on to its second output A2, provided that the protective mechanism does not take effect, i.e. if the signals PS and HA at the inputs E1, E2 of the half-bridge driver T1 are fault-free (i.e. do not both correspond to an ON state at the same time).

The second half-bridge driver T2 has a first input E1 which is connected (via a further logical combination) to the target actuation signal HS or the relevant signal input HS of the target control signal input SI. The second input E2 of the second half-bridge driver T2 is connected (via a further logical combination) to the target actuation signal LS or the relevant signal input LS of the target control signal input SI. The target actuation signal HS is provided for the first half-bridge switch SH ("high-side switch") and the target actuation signal LS is provided for the first half-bridge switch SL ("low-side switch"). The two target actuation signals HS, LS, which are provided for the half-bridge switches SH, SL, are thus supplied to the OR gate OR which is connected upstream of the second input E2 of the first half-bridge driver T1, and are also supplied individually to the first and second inputs E1, E2 of the second half-bridge driver T2 (via the further logical combination with the signal from the second output A2 of the first half-bridge driver). The further logical combination provides for the first input E1 of the second half-bridge driver T2 to receive a HIGH signal (corresponding to an ON signal) only when the signal HS has a HIGH level AND the output A2 of the first half-bridge driver T1 has a HIGH signal (which is produced at said output when output A1 of driver T1 is LOW, i.e. the star point switch is switched off and at least one of the two signals HS, LS has the HIGH level). This also applies accordingly to the input E2 of the second half-bridge driver T2. The further logical combination thus further provides for the second input E2 of the second half-bridge driver T2 to receive a HIGH signal (corresponding to an ON signal) only when the signal LS has a HIGH level AND the output A2 of the first half-bridge driver T1 has a HIGH signal. This combination is provided by the AND gates AND1 and AND2. The second half-bridge driver T2 passes a HIGH signal at input E1 on to output A1 only when E2 is not HIGH. The second half-bridge driver T2 passes a HIGH signal at input E2 on to output A2 only when E1 is not HIGH. This prevents the switches SH, SL from being switched on at the same time.

In the illustrated embodiment, the OR gate, which implements the first-mentioned logical combination, has two diodes. A first diode connects the signal HS to the second input E2 of the first driver T2. A second diode connects the signal LS to the second input E2 of the first driver T2. In order for a HIGH signal to appear at this input E2, it is therefore sufficient for only one of the signals HS, LS to have a HIGH level. A pull-down resistor R3 is provided at the ends of the diodes of the OR gate where they are connected to one another (and connected to E2 of the driver T1). The forward direction of the diodes of the OR gate points to the driver T1 or its input E2. The pull-down resistor R3 connects the output of the OR gate OR or the second input E2 of the first half-bridge driver T1 to a logical LOW potential L-, for instance 0 V.

In the illustrated embodiment, the two AND gates AND1, AND2, which implement the further logical combination, each have two diodes. The diodes of each AND gate have a forward direction that points to the target control signal input SI. The inputs E1, E2 of the second half-bridge driver T2 are each connected to a logical HIGH potential L+, for example +5 V, +10 V, via a pull-up resistor R1, R2. The level of this potential corresponds to the level of the HIGH potential with which the half-bridge drivers operate.

The two half-bridge drivers T1, T2 are each connected to a delay element VG1, VG2, wherein these are at least partially part of the relevant half-bridge driver T1, T2. The delay elements are configured to delay the signal transmission of the relevant half-bridge driver T1, T2 from the associated inputs E1, E2 to the relevant outputs A1, A2. This applies in particular to an enable signal that relates to the enabling of the outputs A1, A2 if the potential at the relevant output is changed to a HIGH signal. The half-bridge drivers T1, T2 can have a dead time input at which the desired delay of the half-bridge driver T1, T2 can be set. For example, a delay time of 50 ns-1000 ns can be set, for example 100, 200 or 500 ns. The delay time is preferably greater than the time required by one of the switches to change the switching state, for example from ON to OFF.

The driver circuit TS has an actual control signal output IO at which the actual control signals HI, PI and LI are specified. The two outputs A1, A2 of the second half-bridge driver T2 are connected to individual outputs of the actual control signal output IO and are provided for the purpose of emitting actual control signals for the two half-bridge switches SH, SL. The first output PI of the first half-bridge driver T2 is connected to an individual output of the actual control signal output IO and is provided for the purpose of emitting an actual control signal for the star point switch SS. The actual control signals differ from the target control signals when the protective mechanism intervenes, i.e. when two or more target signals at the input SI have a HIGH state at the same time (or with a time interval shorter than a predefined time limit).

A multi-phase power factor correction circuit comprises a plurality of the driver circuits TS illustrated and also a plurality of PFC cells PZ. In a multi-phase power factor correction circuit, the plurality of star points are connected to each other and, if necessary, to a neutral conductor connection. The plurality of AC voltage phase connections that result from a multi-phase application are individually connected to the connection points VP. Each AC voltage phase connection is connected to a connection point VP of an individual PFC cell.

The invention claimed is:

1. A driver circuit for a Power Factor Correction Circuit (PFC) cell, having a half-bridge with two half-bridge switches connected via a connection point and a star point switch which connects the connection point to a star point of the PFC cell, wherein the driver circuit has a target control signal input for target actuation signals as well as half-bridge drivers connected downstream of this input in the form of a first half-bridge driver and a second half-bridge driver each with two inputs and two outputs, wherein the half-bridge drivers are configured to transmit signals from the inputs to the outputs only when they are not both in the HIGH state, wherein the first output of the first half-bridge driver is connected in an actuating manner to a control output of the driver circuit for the star point switch, and at least one input of the second half-bridge driver is connected downstream of the second output of the first half-bridge driver, wherein the two outputs of the second half-bridge driver are connected in an actuating manner to control outputs of the driver circuit for the two half-bridge switches.

2. The driver circuit as claimed in claim 1, which has an OR gate, the inputs of which are configured to receive the target actuation signals provided for the two half-bridge switches, wherein the OR gate has an output that has a signal-transmitting connection to the second input of the first half-bridge driver.

3. The driver circuit as claimed in claim 1, wherein a first and a second AND gate are provided between the first half-bridge driver and the second half-bridge driver, wherein a first input of the first AND gate is configured to receive the target actuation signal provided for the first half-bridge switch, a first input of the second AND gate is configured to receive the target actuation signal provided for the second half-bridge switch, second inputs of the AND gates have a signal-transmitting connection to the second output of the first driver, an output of the first AND gate has a signal-transmitting connection to the first input of the second half-bridge driver, and an output of the second AND gate has a signal-transmitting connection to the second input of the second half-bridge driver.

4. The driver circuit as claimed in claim 1, wherein the inputs of the second half-bridge driver are each connected to a logical HIGH potential via a pull-up resistor, and/or wherein the second input of the first half-bridge driver is connected to a logical LOW potential via a pull-down resistor.

5. The driver circuit as claimed in claim 1, wherein the first and/or the second half-bridge driver has/have a delay element which is configured to delay the transmission of signals from the input to the output of the relevant half-bridge driver.

6. The driver circuit as claimed in claim 5, wherein the delay elements act on enable signals for enabling actuation signals at the output of the relevant half-bridge driver or on HIGH signals at the input of the relevant half-bridge driver.

7. A control circuit with a driver circuit as claimed in claim 1 and with a target control signal source which is connected to the target control signal input and is configured to emit target actuation signals for the two half-bridge switches and for the star point switch, wherein the driver circuit has an actual control signal output which is configured to emit actual control signals to the half-bridge switches and the star point switch of the PFC cell that can be connected to the actual control signal output.

8. The control circuit as claimed in claim 7, which has a plurality of the driver circuits having a half-bridge with two half-bridge switches connected via a connection point and a star point switch which connects the connection point to a star point of the PFC cell, wherein the driver circuit has a target control signal input for target actuation signals as well as half-bridge drivers connected downstream of this input in the form of a first half-bridge driver and a second half-bridge driver each with two inputs and two outputs, wherein the half-bridge drivers are configured to transmit signals from the inputs to the outputs only when they are not both in the HIGH state, wherein the first output of the first half-bridge driver is connected in an actuating manner to a control output of the driver circuit for the star point switch, and at least one input of the second half-bridge driver is connected downstream of the second output of the first half-bridge driver, wherein the two outputs of the second half-bridge driver are connected in an actuating manner to control outputs of the driver circuit for the two half-bridge switches, wherein the control circuit is designed to actuate a plurality of the PFC cells.

9. A single-phase or multi-phase power factor correction circuit having one or more PFC cells and having one or more driver circuits which are formed as claimed in claim 1, wherein each PFC cell has a half-bridge having two half-bridge switches connected via a connection point and a star point switch, and a working inductance which connects the connection point to a first AC voltage input, wherein a second AC voltage input is connected to the star point which is formed by a linking point between two capacitors connected in series, wherein the series connection of the capacitors is connected in parallel with the half-bridge, and the ends of the half-bridges form two DC voltage outputs of the power factor correction circuit.

* * * * *